United States Patent
Hirano et al.

(10) Patent No.: US 9,159,902 B2
(45) Date of Patent: Oct. 13, 2015

(54) RESONATOR

(71) Applicant: NIHON DEMPA KOGYO CO., LTD., Tokyo (JP)

(72) Inventors: Keisuke Hirano, Saitama (JP); Noritoshi Kimura, Saitama (JP)

(73) Assignee: NIHON DEMPA KOGYO CO., LTD., Tokyo (JP)

(*) Notice: Subject to any disclaimer, the term of this patent is extended or adjusted under 35 U.S.C. 154(b) by 366 days.

(21) Appl. No.: 13/705,192

(22) Filed: Dec. 5, 2012

(65) Prior Publication Data

US 2013/0140948 A1  Jun. 6, 2013

(30) Foreign Application Priority Data

Dec. 5, 2011  (JP) ................................. 2011-266177
Oct. 3, 2012  (JP) ................................. 2012-220950

(51) Int. Cl.
*H01L 41/09* (2006.01)
*H03H 9/02* (2006.01)
*H03H 9/24* (2006.01)

(52) U.S. Cl.
CPC ........... *H01L 41/09* (2013.01); *H03H 9/02228* (2013.01); *H03H 2009/0244* (2013.01); *H03H 2009/241* (2013.01)

(58) Field of Classification Search
CPC ........... H01L 41/09; H03H 2009/0244; H03H 2009/241; H03H 9/02338
USPC ........... 310/309, 314, 320–321; 333/186, 192
See application file for complete search history.

(56) References Cited

U.S. PATENT DOCUMENTS 7,586,239 B1 * 9/2009 Li et al. .......................... 310/328
7,639,096 B2 * 12/2009 Ikeda et al. .................... 310/348

FOREIGN PATENT DOCUMENTS

JP  02-053313  2/1990
JP  2000-269776  9/2000
JP  2004-282514  10/2004

OTHER PUBLICATIONS

Hirano et al., "Aluminum Nitride Lamb Wave Resonator Using Germanium Sacrificial Layer", Proceedings of the 25th Sensor Symposium, Oct. 2008, pp. 195-198.
Lin et al., "Thermal Compensation for Aluminum Nitride Lamb Wave Resonators Operating at High Temperature", Frequency Control Symposium (FCS), 2010 IEEE International, Jun. 2010, pp. 14-18.
Stephanou et al., "GHZ Contour Extensional Mode Aluminum Nitride MEMS Resonators", Ultrasonics Symposium, 2006. IEEE, Oct. 2006, pp. 2401-2404.
Kuypers et al., "Intrinsic Temperature Compensation of Aluminum Nitride Lamb Wave Resonators for Multiple-Frequency References", Frequency Control Symposium, 2008 IEEE International, May 19-21, 2008, p. 240-249.

* cited by examiner

*Primary Examiner* — Thomas Dougherty
*Assistant Examiner* — Karen B Addison
(74) *Attorney, Agent, or Firm* — Jianq Chyun IP Office

(57) ABSTRACT

A resonator includes an interdigital transducer electrode, a resonance part, a supporting part, and two beam parts. The interdigital transducer electrode is disposed on a piezoelectric thin film. The resonance part is held on a substrate through an air gap. The supporting part supports the resonance part. The two beam parts connect the resonance part to the supporting part at both ends of the resonance part. The air gap forms a level difference at the supporting part or level differences at the respective two beam parts.

6 Claims, 6 Drawing Sheets

RESONATOR

CROSS-REFERENCE TO RELATED APPLICATIONS

This application claims the priority benefit of Japan Patent Application No. 2011-266177, filed on Dec. 5, 2011 and Japan Patent Application No. 2012-220950, filed on Oct. 3, 2012. The entirety of each of the above-mentioned patent applications is hereby incorporated by reference herein and made a part of this specification.

TECHNICAL FIELD

This disclosure relates to a piezoelectric resonator including an interdigital transducer electrode (IDT electrode). In particular, this disclosure relates to a resonator that can prevent damage of a beam which supports a structure of a resonance part and disconnection of an electrode, thus improving reliability of the resonator.

DESCRIPTION OF THE RELATED ART

Traditionally, as a high frequency resonator, there is a Lamb wave type resonator using a Lamb wave. Additionally, as a Lamb wave type resonator, there is a Micro Electro Mechanical Systems (MEMS) type resonator manufactured on a silicon substrate using a semiconductor fabrication technique.

Configuration of the Related Resonator (See FIG. 4)

A configuration of the related resonator will be described by referring to FIG. 4. FIG. 4 is a top view of the related resonator. As illustrated in FIG. 4, the related resonator includes, for example, a region (a silicon region 11) where a silicon substrate is exposed on the inner side of the supporting part 1 formed on the silicon substrate. On this silicon region 11, a resonance part 2 is formed through an air gap (void), and the resonance part 2 is connected to the supporting part 1 by using a beam part 3.

The supporting part 1 is a structure portion that supports the resonance part 2 and the beam part 3. The supporting part 1 extends around the silicon region 11. The resonance part 2 is held on the silicon region 11 by using the beam part 3 with an upward convex shape. Additionally, the resonance part 2 has a top surface part where an IDT electrode 5 is formed. The IDT electrode 5 is connected to an excitation electrode 6 disposed on the supporting part 1 via a wiring formed on the beam part 3. The silicon region 11 is a region where a sacrificial layer for forming the air gap is removed. The silicon region 11 is formed at a position lower than the supporting part 1.

In the resonator of the above-described configuration, for example, the supporting part 1, the resonance part 2, and the beam part 3 are formed by lamination of silicon dioxide ($SiO_2$) and a piezoelectric thin film of aluminum nitride (AlN). On the laminated films, a pattern of the IDT electrode 5 and excitation electrodes 6 are formed with molybdenum (Mo). And, the piezoelectric thin film may be formed with zinc oxide (ZnO) or lead zirconate titanate (PZT: Its composition formula is $Pb(Zr_x, Ti_{1-x})O_3$).

In the resonator of the above-described configuration, if the beam part 3, which connects the supporting part 1 and the resonance part 2 together, is formed thick, this deteriorates vibration characteristic of the resonance part 2 due to anchor loss. Accordingly, the beam part 3 is formed to be thin.

Additionally, in the resonator of the above-described configuration, the resonance part 2 is formed in an air gap structure where a lower portion of the resonance part 2 floats above the silicon substrate, and the resonance part 2 is held with an upward convex shape. Hence, the beam part 3, which supports the resonance part 2, has a level difference 35. This easily damages the beam part 3 and the electrode formed on the beam part 3.

Level Difference in the Beam Part (see FIGS. 5A, 5B, and 5C)

Here, the level difference 35 formed in the beam part 3 will be described by referring to FIGS. 5A, 5B, and 5C. FIG. 5A is a schematic top view of the related resonator. FIG. 5B is a schematic cross-sectional view taken along the line VB-VB of FIG. 5A. FIG. 5C is a schematic cross-sectional view taken along the line VC-VC of FIG. 5A. In FIG. 5A, for ease of visualization, the IDT electrode and the excitation electrode are omitted.

As illustrated in FIGS. 5A and 5B, the supporting part 1 is formed of a $SiO_2$ layer 12 and an AlN layer 13, which are laminated on the silicon substrate. As illustrated in FIG. 5A, the resonance part 2 is formed in the silicon region 11. The silicon region 11 is an inner region, where the silicon is exposed, of the $SiO_2$ layer 12. The silicon region 11 is a region where the sacrificial layer is removed. As illustrated in FIGS. 5A and 5C, the resonance part 2 is held on the silicon region 11 by the beam part 3 through an air gap 16.

Here, a method for fabricating the resonator will be briefly described. First, a sacrificial layer (not shown) made of a material such as germanium is formed on a silicon substrate 10. On the sacrificial layer, a $SiO_2$ layer is formed, a metal (Mo) layer to be a bottom electrode 14 is also formed, and a patterning is performed to shape the bottom electrode 14. Further, the AlN layer 13 is laminated, and a film of a metal layer to be a top electrode 15 is formed, so as to form the IDT electrode, the excitation electrode, and a wiring part.

Next, the AlN layer 13 and the $SiO_2$ layer 12 are processed, and a patterning is performed to shape the resonance part 2. Finally, a germanium, which is an element of the sacrificial layer, is removed by etching with a liquid medicine, and then the air gap 16 is formed. A liquid medicine such as ceric ammonium nitrate is employed.

That is, in the related resonator, the level difference 35 of the beam part 3 is formed by the formation of the air gap 16 at a position corresponding to the boundary between the $SiO_2$ layer 12 and the silicon region 11. Hence, a load to support the resonance part 2 is heavily concentrated on the beam part 3. The level difference between the $SiO_2$ layer 12 and the silicon region 11, which is formed by the air gap 16, is referred to as a level difference part.

A technique related to a Lamb wave resonator is disclosed in Jan H. Kuypers et al, "Intrinsic Temperature Compensation of Aluminum Nitride Lamb Wave Resonators for Multiple-Frequency References", Proc. IEEE 2008, pp. 240-249. A technique to improve structural strength of a crystal unit is disclosed in Japanese Unexamined Patent Application Publication No. 2000-269776 "Surface mount quartz crystal unit" (NIHON DEMPA KOGYO CO., LTD.) and Japanese Unexamined Patent Application Publication No. 02-053313 "Crystal unit" (Fujitsu Limited). Also, a technique related to a resonator with an air gap structure is disclosed in Japanese Unexamined Patent Application Publication No. 2004-282514 "Piezo-resonator circuit and method for manufacturing the same" (MEMS CORE Co., Ltd.).

A temperature compensation is disclosed in Jan H. Kuypers et al, "Intrinsic Temperature Compensation of Aluminum Nitride Lamb Wave Resonators for Multiple-Frequency References", Proc. IEEE 2008, p 240-249. The temperature compensation in the case where the Lamb wave resonance using AlN is applied to a quartz crystal unit and a temperature compensated crystal oscillator (TCXO) at a band width of 100 MHz to 1000 MHz.

Japanese Unexamined Patent Application Publication No. 2000-269776 discloses an air-gap type quartz crystal unit where excitation electrodes are not directly formed on a crystal element. The crystal element is housed in a casing. The casing is sealed with a cover. The excitation electrodes are formed on an inner bottom surface of the casing and an inner surface of the cover. The excitation electrode is extended to an external surface of the casing as a mounting terminal to improve impact resistance.

Japanese Unexamined Patent Application Publication No. 02-053313 discloses a quartz crystal unit where a vibration substrate includes a vibrator. The vibration substrate is sandwiched between a pair of plates having electrodes on surfaces facing the vibrator. Inert gas is enclosed within its clearance space.

Japanese Unexamined Patent Application Publication No. 2004-282514 discloses a formation of a piezoelectric resonator with an air gap structure using germanium as a sacrificial layer.

However, the related resonator includes a thin beam part to prevent deterioration in characteristics due to anchor loss. The air gap causes a level difference in the middle of the beam part. This applies a heavy load on the beam part. A problem arises in that this easily damages the beam part and disconnects the wiring formed on the beam part.

The aforementioned publications do not disclose any configuration where the beam part is formed thin in a part connected to the resonance part while the beam part is formed thick from a part of the level difference to the supporting part.

A need thus exists for a resonator which is not susceptible to the drawback mentioned above.

SUMMARY

This disclosure has been made to solve the aforementioned problems, and it is an object of this disclosure to provide a resonator that prevents deterioration in characteristics due to anchor loss while improving structural strength. The resonator also prevents damage in a beam part and disconnection of a wiring part so as to improve reliability.

According to an aspect of this disclosure, there is provided a resonator. The resonator includes an interdigital transducer electrode, a resonance part, a supporting part, and two beam parts. The interdigital transducer electrode is disposed on a piezoelectric thin film. The resonance part is held on a substrate through an air gap. The supporting part supports the resonance part. The two beam parts connect the resonance part to the supporting part at both ends of the resonance part. The air gap forms a level difference at the supporting part or level differences at the respective two beam parts.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

Figure 1:
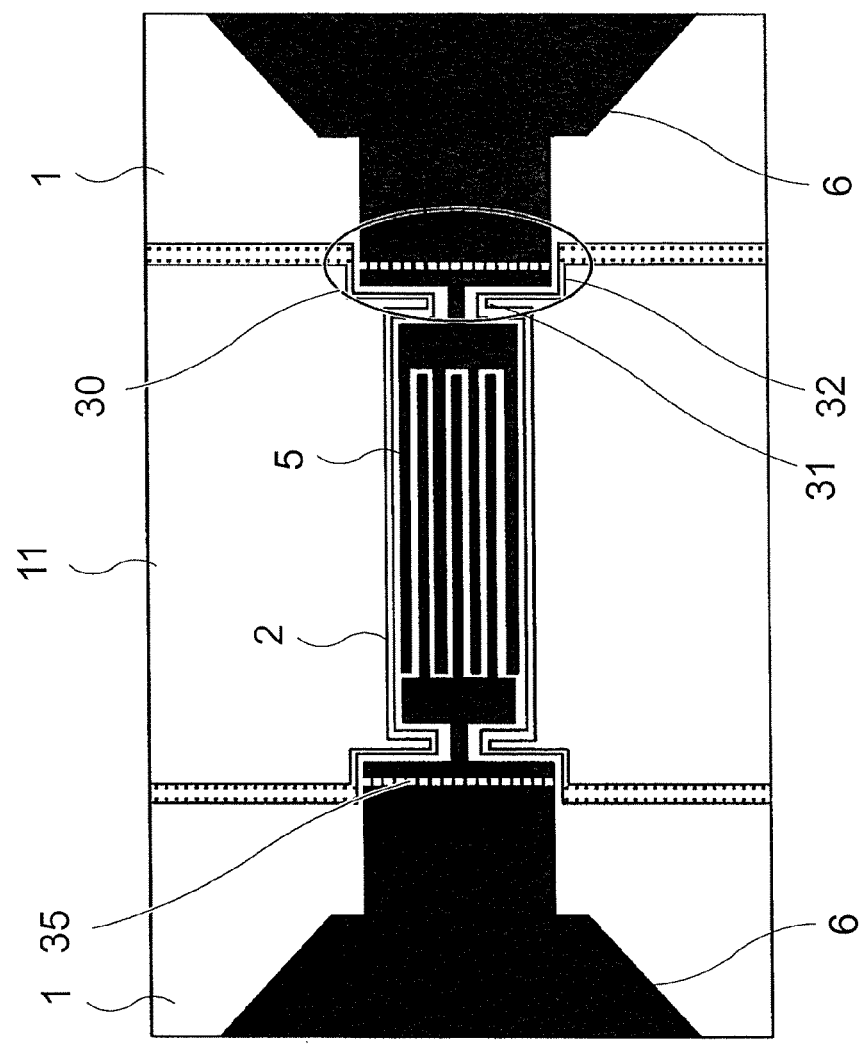
FIG. 1 is a top view of a resonator according to a first embodiment disclosed here.

The embodiments of this disclosure will be described with referring to the drawings.

Overview of an Embodiment

In the resonator according to the embodiment of this disclosure, a beam part, which connects a resonance part and a supporting part together, is formed thick from the supporting part to a region where a level difference is formed by an air gap. In contrast, the beam part is formed thin in a part connected to the resonance part. The level difference caused by the air gap is formed as the thick part. This prevents damage in the beam part and disconnection of wiring. Furthermore, the part connected to the resonance part is formed thin. This reduces deterioration in vibration characteristics due to anchor loss.

Another resonator according to the embodiment of this disclosure has a beam part that is formed to be thin, similarly to the related beam part. A $SiO_2$ layer has an end part that becomes a boundary on the silicon region. This end part is formed on the outside of an end part of an MN layer on the $SiO_2$ layer. Here, the silicon region is extended to the outside of the beam part. This forms the level difference formed by the air gap on the supporting part, but not on the beam part. This prevents damage in the beam part and disconnection of wiring.

Resonator According to a First Embodiment (see FIG. 1)

A resonator according to a first embodiment will be described by referring to FIG. 1. FIG. 1 is a top view of a resonator according to the first embodiment. As illustrated in FIG. 1, the resonator according to the first embodiment (first resonator) includes a supporting part 1, a resonance part 2, and a beam part 30 on a silicon substrate, similarly to the related resonator illustrated in FIG. 4. The resonance part 2 with an air gap structure is connected to the supporting part 1 by using the beam part 30, and is held on a silicon region 11.

Figure 4:
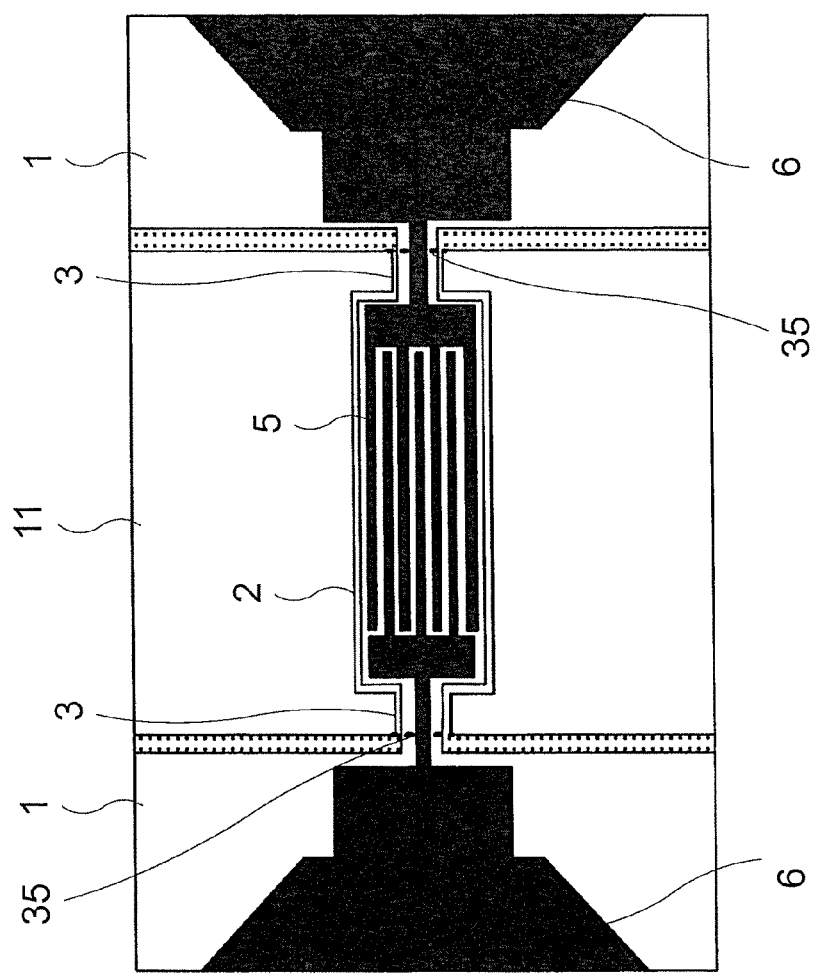
FIG. 4 is a top view of a resonator as a related art.

In the first resonator, the resonance part 2 and an IDT electrode 5 have a configuration similar to that of the related resonator illustrated in FIG. 4. As a characteristic of the first resonator, the beam part 30 includes two parts with different thickness. Specifically, the beam part 30 of the first resonator includes a thin beam part 31 connected to the resonance part 2 and an extended beam part 32 connected to the supporting part 1.

A characterizing portion of the first resonator will be described. The thin beam part 31 is connected to the resonance part 2 and formed to be thin (narrow), similarly to the related beam part. Accordingly, the vibration of the resonance part 2 is unaffected. The thin beam part 31 is formed from the position connected to the resonance part 2 to the position before the level difference 35 formed by an air gap.

The extended beam part 32 is a characterizing portion of the first resonator. The extended beam part 32 is connected to the thin beam part 31 and formed across the level difference 35 formed by the air gap. That is, the first resonator has the extended beam part 32 in the region including the level difference 35 formed by the air gap. Moreover, the resonance part 2 is supported by the extended beam part 32 with sufficient strength and width. This allows the resonance part 2 to be held without load concentration on the beam part 30 even if the air gap is formed. This prevents the beam part 30 from being damaged.

The first resonator includes wiring parts on the excitation electrode 6 and the beam part 30 corresponding to a shape of the beam part 30. That is, the wiring part on the extended beam part 32, where a level difference occurs, is formed extensively. This prevents disconnection of wiring at the level difference 35.

Figure 2:
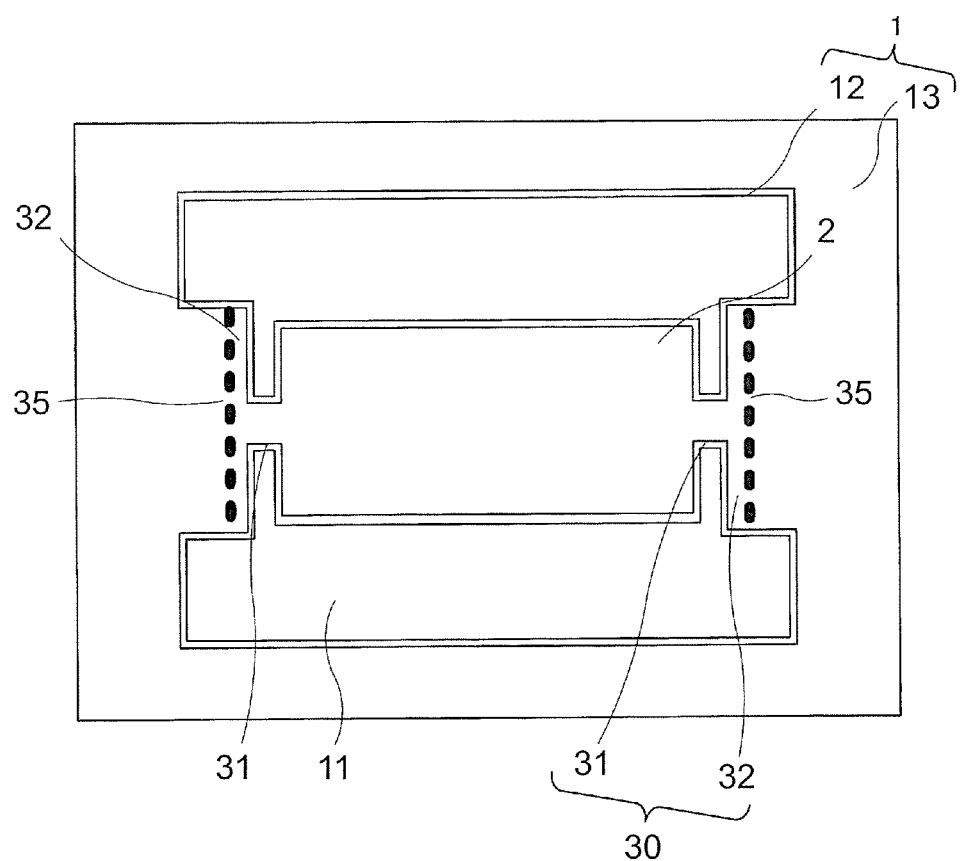
FIG. 2 is a schematic top view of the resonator according to the first embodiment.

Level Difference in the Beam Part of the First Resonator (see FIG. 2)

Figure 5A:
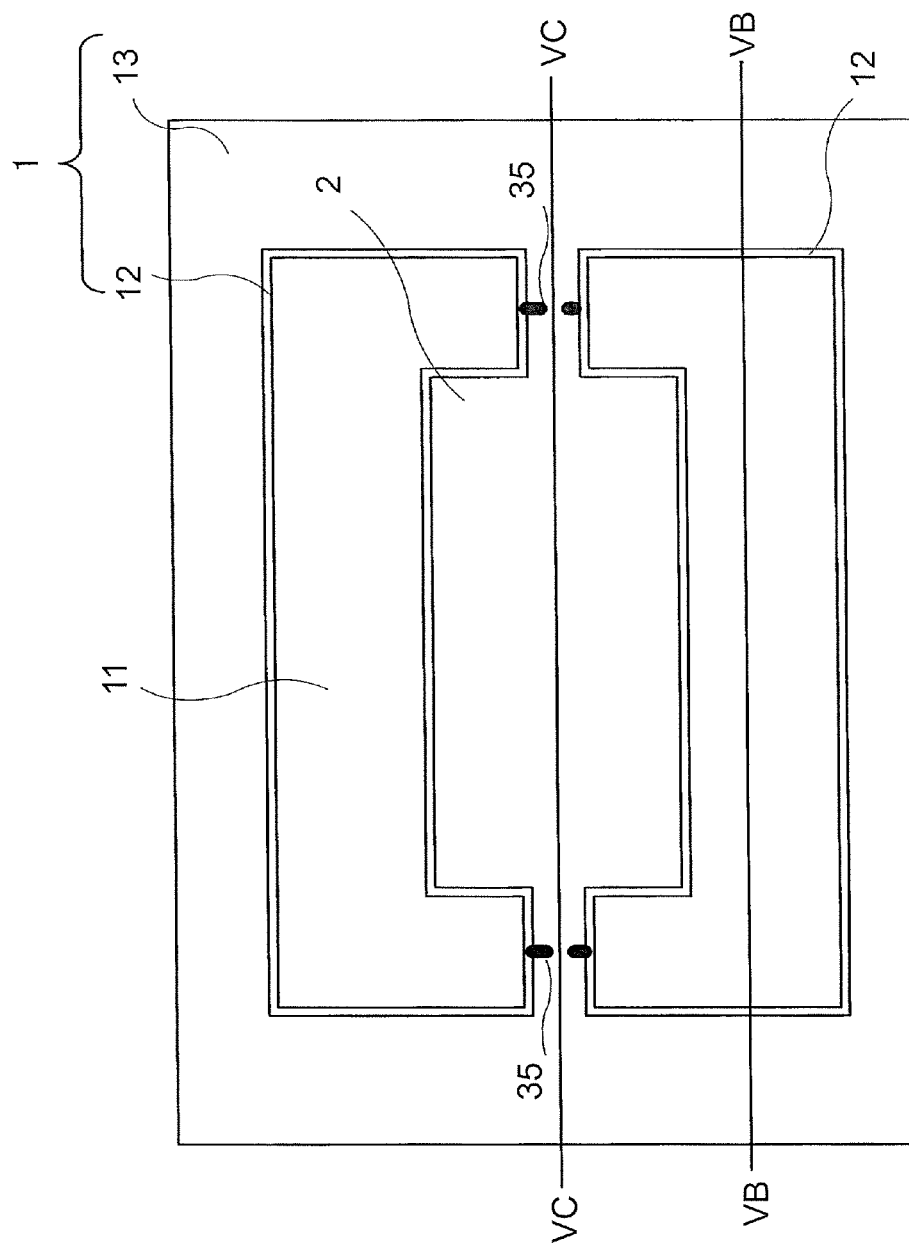
FIG. 5A is a schematic top view of the related resonator.
Figure 5B:
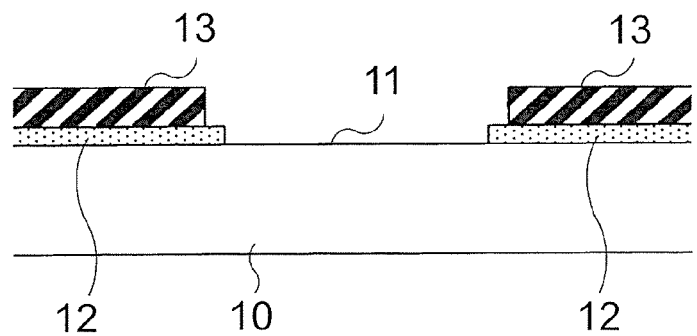
FIG. 5B is a schematic cross-sectional view taken along the line VB-VB of FIG. 5A.
Figure 5C:
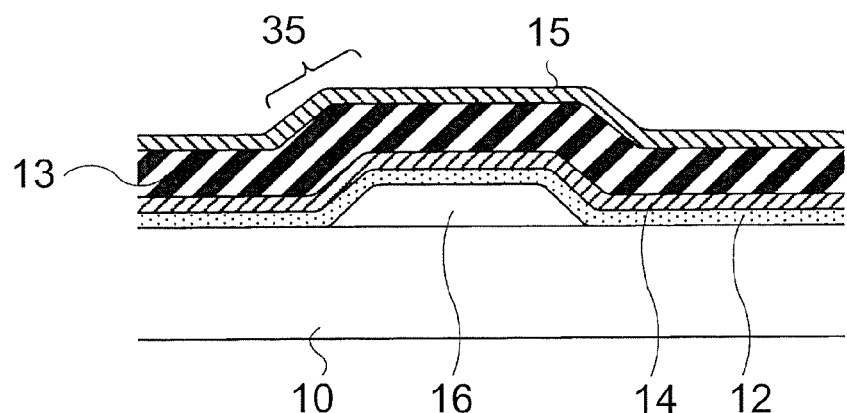
FIG. 5C is a schematic cross-sectional view taken along the line VC-VC of FIG. 5A.

Next, a level difference in the beam part of the first resonator will be described by referring to FIG. 2. FIG. 2 is a schematic top view of the first resonator. For ease of visualization, the IDT electrode and the excitation electrodes are omitted in FIG. 2. Since the cross-sectional surface and the method for manufacturing the first resonator are similar to the surface and the method for manufacturing the related resonator illustrated in FIGS. 5A, 5B, and 5C, these configurations are not further elaborated here.

As illustrated in FIG. 2, the first resonator includes the supporting part 1 including a $SiO_2$ layer 12 and an AlN layer 13. The silicon region 11 exposes a silicon on the inner side of the region where the $SiO_2$ layer 12 is formed. The resonance part 2 is formed on the silicon region 11 through an air gap. The resonance part 2 is connected to the supporting part 1 by using the beam part 30. Instead of the AlN layer 13, a ZnO layer or a PZT layer may be employed.

Then, as described above, in the first resonator, the beam part 30 includes the thin beam part 31 and the extended beam part 32. The thin beam part 31 is connected to the resonance part 2. The extended beam part 32 connects the thin beam part 31 and the supporting part 1 together. The beam part 30 is formed by lamination of the $SiO_2$ layer 12 and the AlN layer 13, similarly to the configuration of the supporting part 1. The thin beam part 31 has a first width. The first width is about the same thickness as a width of the related beam part 3. The width of the extended beam part 32 is formed as a second width wider than the first width. In the example of FIG. 2, the extended beam part 32 has a width that is wider than a width of the resonance part 2 (the vertical direction in FIG. 2).

In the first resonator, the extended beam part 32 is formed at the upper portion adjacent to the edge of a sacrificial layer when patterning is performed for the $SiO_2$ layer 12 and the AlN layer 13. As illustrated in FIG. 2, the extended beam part 32 is formed at a position of the level difference 35 corresponding to the end part of the $SiO_2$ layer 12, which is a boundary between a silicon region 11, where the silicon substrate is exposed, and the supporting part 1. The level difference 35 is formed by the sacrificial layer before removal.

The extended beam part 32 has a sufficient width so as not to be damaged on the level difference 35 formed by the air gap. Wiring can also be extensively provided on the extended beam part 32. This prevents damage in the beam part 30 and disconnection of wiring. This improves a yield at manufacturing, thus increasing in structural strength.

The thin beam part 31 is formed in a flat part where the slope of the level difference 35 ends. Therefore, the thin beam part 31 does not undergo a heavy load and avoids damage. In the first resonator, since the thin beam part 31, which is directly connected to the resonance part 2, is formed to be thin similarly to the formation of the related beam part. This prevents anchor loss.

Effect of the First Embodiment

In the resonator according to the first embodiment of this disclosure, the beam part 30, which connects the resonance part 2 and the supporting part 1 together, includes the thin beam part 31 and the extended beam part 32. The thin beam part 31 has the first width and is connected to the resonance part 2. The extended beam part 32 is formed with the second width, which is wider than the first width, and is connected to the thin beam part 31 and the supporting part 1. The extended beam part 32 is formed at the position where the level difference 35 is formed by the air gap. Further, the wiring width on the extended beam part 32 is formed to be wider than the wiring width formed on the thin beam part 31. Accordingly, the beam part 30 has the wide part where the level difference 35 is formed so as to improve the structural strength. This prevents damage in the beam part 30 and disconnection of the wiring. Further, forming the thin beam part 31 thin, which is connected to the resonance part 2, reduces deterioration in characteristics due to anchor loss.

In the first resonator, the beam part 30 including the extended beam part 32 and the wide wiring part is formed without adding a special process. This easily achieves a resonator that prevents damage in the beam part and the wiring part.

Resonator According to a Second Embodiment

Figure 3A:
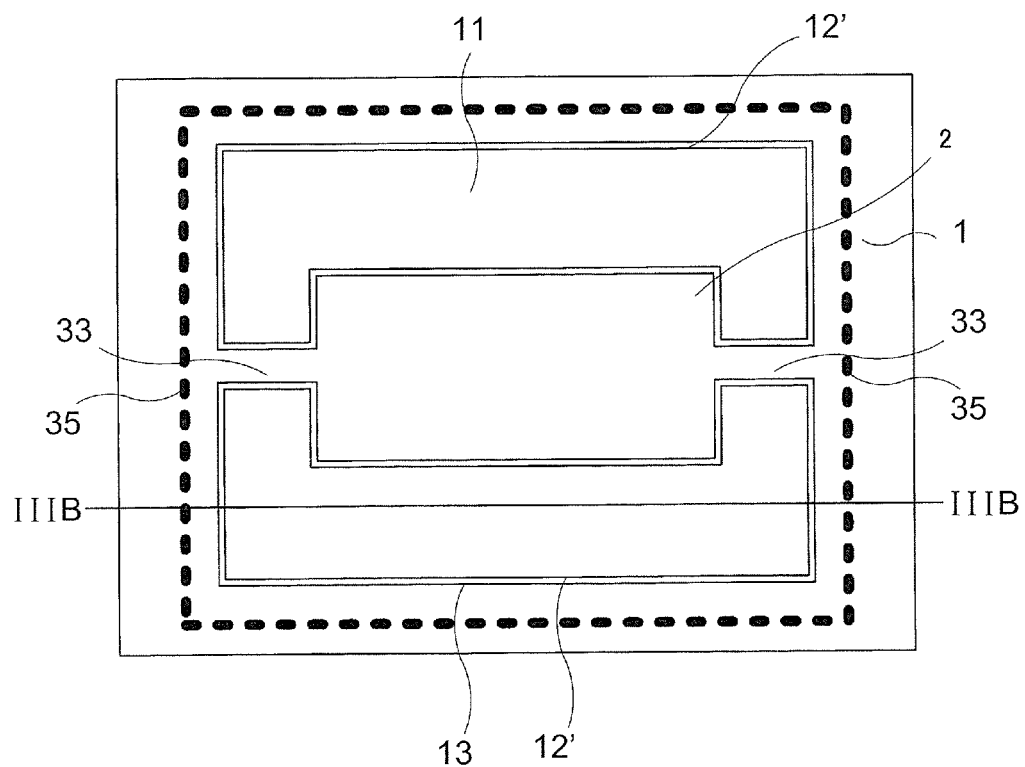
FIG. 3A is a schematic top view of the resonator according to a second embodiment disclosed here.
Figure 3B:
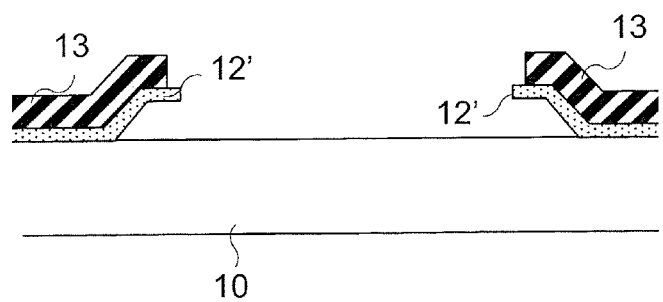
FIG. 3B is a schematic cross-sectional view taken along the line IIIB-IIIB of FIG. 3A.

Next, the resonator according to a second embodiment of this disclosure will be described by referring to FIGS. 3A and 3B. FIG. 3A is a schematic top view of the resonator according to the second embodiment. FIG. 3B is a schematic cross-sectional view taken along the line IIIB-IIIB of FIG. 3A. Note that FIG. 3A omits the illustrations of an IDT electrode and an excitation electrode for ease of visualization. The resonator according to the second embodiment (a second resonator) has a basic configuration similar to that of the related resonator. The second resonator differs from the related resonator in a position of the end part of the sacrificial layer that forms a level difference by an air gap, that is, the second resonator differs in the position of the end part where the $SiO_2$ layer contacts the silicon region 11.

As illustrated in FIGS. 3A and 3B, in the second resonator, the resonance part 2, which includes the air gap structure and is connected to the supporting part 1 by using a beam part 33 having a narrow width, is held on the silicon region 11. In the second resonator, the configurations of the resonance part 2, the IDT electrode, and the beam part 33 are similar to those of the related resonator. The width of the beam part 33 is also formed to be thin, similarly to the width of the related beam part, for preventing anchor loss.

As illustrated in FIG. 3A, the second resonator features a formation of the level difference 35 in the region of the supporting part 1. Specifically, as illustrated in FIGS. 3A and 3B, in the second resonator, the sacrificial layer is formed to be further expanded than that of the first resonator. On this sacrificial layer, a $SiO_2$ layer 12' and the AlN layer 13 are formed. This allows exposing the silicon region 11, where the sacrificial layer is removed and the silicon substrate is exposed, under the AlN layer 13 and the $SiO_2$ layer 12'.

Hence, the level difference 35 formed by etching of the sacrificial layer is disposed not on the beam part 33 but on the supporting part 1. The supporting part 1 is adjacent to the beam part 33 on outside of the root part of the beam part 33, and the beam part 33 is connected to the supporting part 1. Thus, the second resonator does not have the level difference 35 in the beam part 33 to prevent damage in the beam part 33 and disconnection of the wiring. To reduce stress caused by the level difference 35, it is preferred that the $SiO_2$ layer 12' and the AlN layer 13 be formed in appropriate film thicknesses.

While in the example of FIGS. 3A and 3B, the $SiO_2$ layer 12' is formed such that the whole silicon region 11 extends outward, the silicon region 11 adjacent to the beam part 33 may be extended so as to form the end part of the air gap under the supporting part 1.

Effect of the Second Embodiment

In the resonator according to the second embodiment of this disclosure, the SiO$_2$ layer 12' around the silicon region 11 is formed on the outside of the end part of the AlN layer 13 adjacent to the beam part 33. The beam part 33 is formed narrow similarly to the related beam part. A level difference formed by an air gap is formed not on the beam part 33, but on the supporting part 1, thus preventing damage in the beam part 33 and disconnection of wiring. This reduces deterioration in characteristics due to anchor loss.

This disclosure is suitable for a resonator that prevents damage in a beam supporting a structure of the resonator and disconnection of an electrode, thus improving reliability.

The resonator according to this disclosure may include an interdigital transducer electrode disposed on a piezoelectric thin film, a resonance part held on a substrate through an air gap, a supporting part that supports the resonance part, and two beam parts that connect the resonance part to the supporting part at both ends of the resonance part. The beam part includes a thin beam part with a first width that is connected to the resonance part, and an extended beam part with a second width that is connected to the supporting part. The second width is wider than the first width. The air gap forms a level difference where the extended beam part is formed.

The resonator according to this disclosure may include the aforementioned resonator that includes a wiring part connected to the interdigital transducer electrode on the beam part. The wiring part includes a part formed on the extended beam part that has a width wider than that of a portion formed on a thin beam part.

The resonator according to this disclosure may include a resonator that includes an interdigital transducer electrode disposed on a piezoelectric thin film, a resonance part held on a substrate through an air gap, a supporting part that supports the resonance part, and two beam parts that connect the resonance part to the supporting part at both ends of the resonance part where the air gap forms a level difference in the supporting part.

This disclosure includes the aforementioned resonator that includes the piezoelectric thin film employing one of aluminum nitride, zinc oxide, and lead zirconate titanate.

With the resonator according to this disclosure, the resonator includes the IDT electrode formed on the piezoelectric thin film. The resonator also includes the resonance part held on the substrate through the air gap, the supporting part that supports the resonance part, and two beam parts that connect the resonance part and the supporting part at both ends of the resonance part. The resonator includes the beam part consists of the thin beam part, which connects to the resonance part at the first width, and the extended beam part, which connects to the supporting part and the second width wider than the first width. The extended beam part is formed on the level difference formed by the air gap, and the thin beam part with a narrow width is connected to the resonance part. This prevents deterioration in vibration characteristic due to anchor loss. Disposing the wide extended beam part at the level difference strengthens the beam part and prevents damage in the beam part, thus ensuring improved reliability.

With the resonator according to this disclosure, the resonator includes the wiring part connected to the IDT electrode on the beam part. In the aforementioned resonator, the wiring part formed on the extended beam part is wider than the wiring part formed on the thin beam part. This widens a wiring area at the level difference part, preventing disconnection and improving reliability.

Additionally, with the resonator according to this disclosure, the resonator includes the IDT electrode formed on the piezoelectric thin film. The resonator also includes the resonance part held on the substrate through the air gap, the supporting part that supports the resonance part, and two beam parts that connect the resonance part and the supporting part at both ends of the resonance part. The resonator includes the level difference caused by the air gap on the supporting part. This reduces the load caused by the level difference on the beam part, prevents damage in the beam part, and improves reliability.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A resonator comprising:
   an interdigital transducer electrode, being disposed on a piezoelectric thin film;
   a resonance part, being held on a substrate through an air gap;
   a supporting part, supporting the resonance part; and
   two beam parts, connecting the resonance part to the supporting part at both ends of the resonance part,
   wherein, the air gap forms a level difference at the supporting part, or
   each beam part includes a thin beam part and an extended beam part, wherein the extended beam part is disposed where the air gap forms the level difference.

2. The resonator according to claim 1, wherein,
   the thin beam part has a first width, the thin beam part being connected to the resonance part; and
   the extended beam part has a second width, the extended beam part being connected to the supporting part, the second width being wider than the first width.

3. The resonator according to claim 2, further comprising:
   a wiring part, being connected to the interdigital transducer electrode on the beam part, wherein,
   the wiring part includes a part formed on the extended beam part, the part having a width wider than a width of a portion on a thin beam part.

4. The resonator according to claim 1, wherein,
   the piezoelectric thin film employs one of aluminum nitride, zinc oxide, and lead zirconate titanate.

5. The resonator according to claim 2, wherein,
   the piezoelectric thin film employs one of aluminum nitride, zinc oxide, and lead zirconate titanate.

6. The resonator according to claim 3, wherein,
   the piezoelectric thin film employs one of aluminum nitride, zinc oxide, and lead zirconate titanate.

* * * * *